United States Patent [19]
Tanaka et al.

[11] Patent Number: 5,778,032
[45] Date of Patent: Jul. 7, 1998

[54] DATA REPRODUCING METHOD AND DATA REPRODUCING UNIT

[75] Inventors: Koichiro Tanaka, Katano; Tomohiro Kimura, Kawachinagano; Akihiro Tatsuta, Nara; Tomonori Shiomi, Hirakata, all of Japan

[73] Assignee: Matsushita Electric Industrial Co., Ltd., Osaka-fu, Japan

[21] Appl. No.: 605,984

[22] Filed: Feb. 23, 1996

[30] Foreign Application Priority Data

Feb. 24, 1995 [JP] Japan ............... 7-036783

[51] Int. Cl.$^6$ ............... H04L 7/00; H03D 3/24
[52] U.S. Cl. ............... 375/355; 375/376
[58] Field of Search ............... 375/340, 354, 375/355, 371, 373, 375, 376; 364/728.03, 728.04, 728.07; 327/147, 149, 150

[56] References Cited

U.S. PATENT DOCUMENTS

| | | |
|---|---|---|
| 5,455,847 | 10/1995 | Guilford et al. |
| 5,535,252 | 7/1996 | Kobayashi ............... 375/371 |
| 5,638,409 | 6/1997 | Awata et al. ............... 375/355 |
| 5,706,314 | 1/1998 | Davis et al. ............... 375/340 |

FOREIGN PATENT DOCUMENTS 3-69238  3/1991  Japan.

Primary Examiner—Chi H. Pham
Assistant Examiner—William Luther
Attorney, Agent, or Firm—Wenderoth, Lind & Ponack, L.L.P.

[57] ABSTRACT

A sampler (1) samples an inputted base band signal in accordance with a sampling clock, and holds a sample value ($S_n$). Delay circuits (7, 8) hold sample values ($S_{n-1}$, $S_{n-2}$), respectively. A decision circuit (2) determines the sample value ($S_{n-1}$), and outputs data ($d_{n-1}$). A constant multiplier (16) multiplies the data ($d_{n-1}$) by a constant ($\alpha$). A subtracter (17) subtracts the data ($d_{n-1}$) from the sample value ($S_{n-1}$). Another subtracter (13) subtracts the sample value ($S_n$) from the sample value ($S_{n-2}$). A multiplier (14) multiplies the output of the subtracter (17) by that of the subtracter (13), and outputs a timing error signal. A low-pass filter (15) extracts a low frequency component of the timing error signal, and supplies a control voltage to a voltage controlled oscillator (6). The voltage controlled oscillator (6) outputs a sampling clock having a frequency which depends on the control voltage.

13 Claims, 14 Drawing Sheets

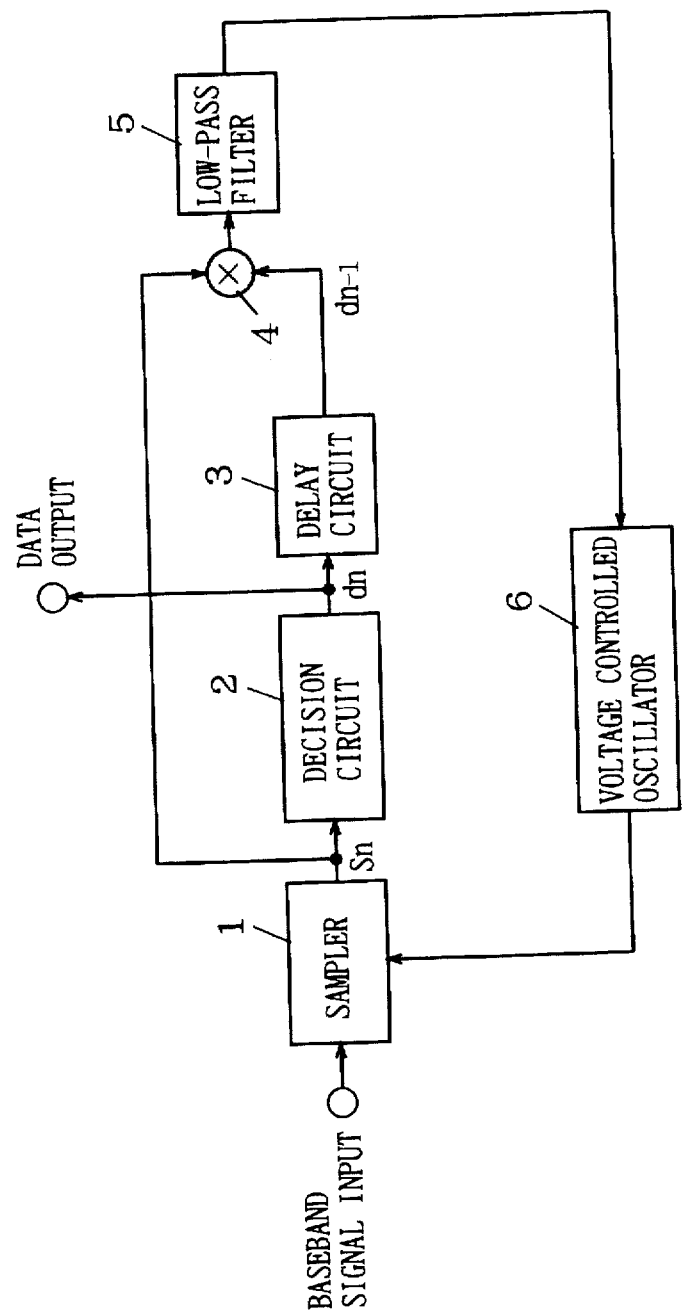
F I G. 1

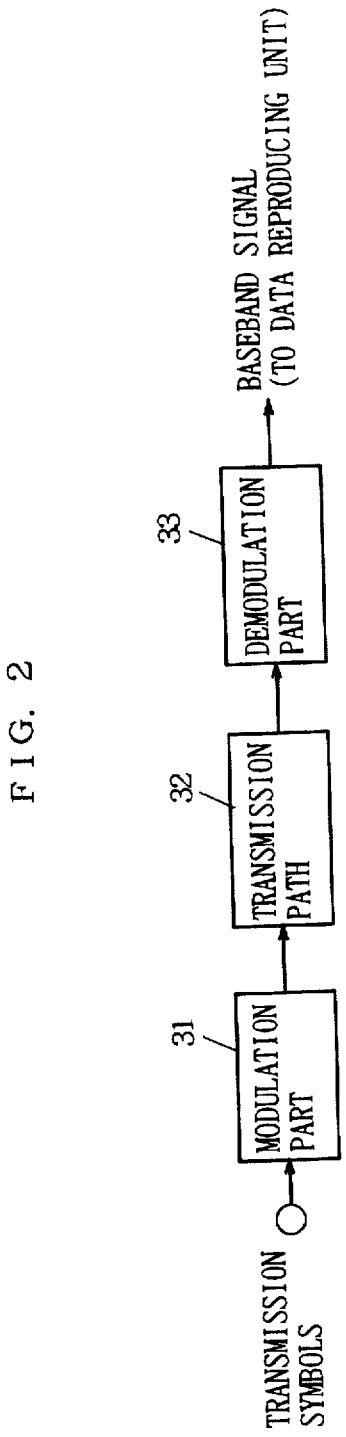

DATA REPRODUCING METHOD AND DATA REPRODUCING UNIT

BACKGROUND OF THE INVENTION

1. Field of the Invention

The present invention relates to a data reproducing unit, and more specifically, it relates to a data reproducing unit for sampling a base band signal and converting the same to data.

2. Description of the Background Art

In general, a clock signal having a prescribed cycle and a prescribed phase is required for converting a base band signal to data. In order to generate such a clock signal, generally employed is a clock reproducing circuit for reproducing a prescribed clock signal from the base band signal.

A conventional data reproducing unit is now described. FIG. 14 is a block diagram showing the conventional data reproducing unit. Referring to FIG. 14, this data reproducing unit comprises a clock component extraction circuit 21, a phase comparison circuit 22, a low-pass filter 23, a voltage controlled oscillator 24, a phase shift circuit 25, a sampler 26 and a determination circuit 27.

The clock component extraction circuit 21, which is formed by a zero cross detector or a square circuit, extracts a signal having a symbol rate component from a base band signal inputted therein. The voltage controlled oscillator 24 generates a clock for sampling the base band signal at a prescribed timing in accordance with a control voltage. The phase comparison circuit 22 detects the phase difference between the signal from the clock component extraction circuit 21 and the clock from the voltage controlled oscillator 24, and outputs a phase difference signal. The low-pass filter 23 extracts a low frequency component of this phase difference signal, and supplies the same to the voltage controlled oscillator 24 as the control voltage. A clock which is in a constant phase relation to the base band signal is obtained by a phase locked loop (PLL) which is formed by the phase comparison circuit 22, the low-pass filter 23 and the voltage controlled oscillator 24. The phase shift circuit 25 adjusts the phase of this clock, and supplies a sampling clock to the sampler 26 for sampling the base band signal when its eye pattern opening is maximized. The sampler 26 samples the base band signal in synchronization with the sampling clock which is supplied from the phase shift circuit 25. The determination circuit 27 determines the sign and the magnitude of the base band signal which is sampled in the sampler 26, and outputs data.

As hereinabove described, the conventional data reproducing unit requires information at large points of time in addition to that required for determining the data, in order to detect zero cross of the base band signal, square the overall base band signal, and the like. In the conventional data reproducing unit, therefore, the clock component extraction circuit 21 must disadvantageously be driven at a higher frequency as compared with the symbol rate.

Further, the phase shift circuit 25 is required for sampling the base band signal when its eye pattern opening is maximized, and the same must be adjusted while observing the eye pattern and the error rate.

SUMMARY OF THE INVENTION

Accordingly, an object of the present invention is to provide a data reproducing unit which is not required to be driven at a frequency higher than a symbol rate, without adjustment of a phase shift.

Each of first to sixth aspects of the present invention is directed to a method for reproducing original data from a sample value obtained by sampling an input signal.

The first aspect is characterized in that:

a correlation value is calculated between a sample value series obtained by sampling an input signal at a symbol rate and an estimate value series obtained by shifting an estimate value series of a transmission symbol corresponding to the sample value series by one symbol on the time axis, and a point of time for sampling the input signal is adjusted according to the polarity of the correlation value.

The second aspect is characterized in that:

a first correlation value is calculated between a sample value series obtained by sampling an input signal at a symbol rate and a first estimate value series obtained by shifting an estimate value series of a transmission symbol corresponding to the sample value series by one symbol on the time axis, a second correlation value is calculated between the sample value series and a second estimate value series obtained by shifting the estimate value series of the transmission symbol corresponding to the sample value series by one symbol oppositely to the first estimate value series, and a point of time for sampling the input signal is adjusted according to the polarity of the difference between the first and second correlation values.

The third aspect is characterized in that:

a difference value series is calculated by subtracting a constant multiple of an estimate value series of a transmission symbol corresponding to a sample value series obtained by sampling an input signal at a symbol rate from the sample value series, a correlation value is calculated between the difference value series and an estimate value series obtained by shifting the estimate value series by one symbol on the time axis, and a point of time for sampling the input signal is adjusted according to the polarity of the correlation value.

The fourth aspect is characterized in that:

a difference value series is calculated by subtracting a constant multiple of an estimate value series of a transmission symbol corresponding to a sample value series obtained by sampling an input signal at a symbol rate from the sample value series, a first correlation value is calculated between the difference value series and a first estimate value series obtained by shifting the estimate value series by one symbol on the time axis, a second correlation value is calculated between the difference value series and a second estimate value series obtained by shifting the estimate value series by one symbol oppositely to the first estimate value series, and a point of time for sampling the input signal is adjusted according to the polarity of the difference between the first and second correlation values.

The fifth aspect is characterized in that:

a difference value series is calculated by subtracting a constant multiple of an estimate value series of a transmission symbol corresponding to a sample value series obtained by sampling an input signal at a symbol rate from the sample value series, a correlation value is calculated between the difference value series and a first sample value series obtained by shifting the sample value series by one symbol on the time axis, and a point of time for sampling the input signal is adjusted according to the polarity of the correlation value.

The sixth aspect is characterized in that:

a difference value series is calculated by subtracting a constant multiple of an estimate value series of a transmission symbol corresponding to a sample value series obtained by sampling an input signal at a symbol rate from the sample value series, a first correlation value is calculated between the difference value series and a first sample value series obtained by shifting the sample value series by one symbol on the time axis, a second correlation value is calculated between the difference value series and a second sample value series obtained by shifting the sample value series by one symbol oppositely to the first sample value series, and a point of time for sampling the input signal is adjusted according to the polarity of the difference between the first and second correlation values.

Each of seventh to thirteenth aspects of the present invention is directed to a unit for reproducing original data from a sample value which is obtained by sampling an input signal.

The seventh aspect is characterized in that the unit comprises:

a clock generation part for generating a sampling clock, a sampler for sampling an input signal in synchronization with the sampling clock and outputting a sample value, an estimate value generation part for generating an estimate value of a transmission symbol shifting from the sample value by one symbol on the time axis, a multiplication part for multiplying the estimate value by the sample value, and a low-pass filter for passing a low frequency component of the output of the multiplication part, and a phase of the sampling clock in the clock generation part is changed by the output of the low-pass filter.

The eighth aspect is characterized in that the unit comprises:

a clock generation part for generating a sampling clock, a sampler for sampling an input signal in synchronization with the sampling clock and outputting the sample value, an estimate value generation part for generating a first estimate value of a transmission symbol shifting from the sample value by one symbol on the time axis and a second estimate value of a transmission symbol shifting from the sample value by one symbol oppositely to the first estimate value, a first multiplication part for multiplying the sample value by the first estimate value, a second multiplication part for multiplying the sample value by the second estimate value, a first low-pass filter for passing a low frequency component of the output of the first multiplication part, a second low-pass filter for passing a low frequency component of the output of the second multiplication part, and a subtraction part for subtracting the output of the second low-pass filter from that of the first low-pass filter, and a phase of the sampling clock in the clock generation part is changed by the output of the subtraction part.

The ninth aspect is characterized in that the unit comprises:

a clock generation part for generating a sampling clock, a sampler for sampling an input signal in synchronization with the sampling clock and outputting the sample value, an estimate value generation part for generating a first estimate value of a transmission symbol shifting from the sample value by one symbol on the time axis and a second estimate value of a transmission symbol shifting from the sample value by one symbol oppositely to the first estimate value, a subtraction part for subtracting the second estimate value from the first estimate value, a multiplication part for multiplying the sample value by the output of the subtraction part, and a low-pass filter for passing a low frequency component of the output of the multiplication part, and a phase of the sampling clock in the clock generation part is changed by the output of the low-pass filter.

The tenth aspect is characterized in that the unit comprises:

a clock generation part for generating a sampling clock, a sampler for sampling an input signal in synchronization with the sampling clock and outputting the sample value, a first arithmetic part for subtracting a constant multiple of an estimate value of a transmission symbol for the sample value from the sample value, a second arithmetic part for multiplying an estimate value of a transmission symbol shifting from the sample value by one symbol on the time axis by the output of the arithmetic part, and a low-pass filter for passing low frequency components of the outputs of the arithmetic part, and a phase of the sampling clock in the clock generation part is changed by the output of the low-pass filter.

The eleventh aspect is characterized in that the unit comprises:

a clock generation part for generating a sampling clock, a sampler for sampling an input signal in synchronization with the sampling clock and outputting the sample value, a first arithmetic part for subtracting a constant multiple of an estimate value of a transmission symbol for the sample value from the sample value, a second arithmetic part for subtracting a second estimate value of a transmission symbol shifting from the sample value by one symbol oppositely to a first estimate value on the time axis from the first estimate value of a transmission symbol shifting from the sample value by one symbol on the time axis, multiplication part for multiplying the output of the first arithmetic part by that of the second arithmetic part, and a low-pass filter for passing a low frequency component of the output of the multiplication part, and a phase of the sampling clock in the clock generation part is changed by the output of the low-pass filter.

The twelfth aspect is characterized in that the unit comprises:

a clock generation part for generating a sampling clock, a sampler for sampling an input signal in synchronization with the sampling clock and outputting a first sample value, an arithmetic part for subtracting a constant multiple of an estimate value of a transmission symbol for the first sample value from the first sample value, a multiplication part for multiplying a second sample value shifting from the first sample value by one symbol on the time axis by the output of the arithmetic part, and a low-pass filter for passing a low frequency component of the output of the multiplication part, and a phase of the sampling clock in the clock generation part is changed by the output of the low-pass filter.

The thirteenth aspect is characterized in that the unit comprises:

a clock generation part for generating a sampling clock, a sampler for sampling an input signal in synchronization with the sampling clock and outputting the sample value, an arithmetic part for subtracting a constant multiple of an estimate value of a transmission symbol for a first sample value which is in a prescribed time relation to the sample value from the first sample value, so that the output of the arithmetic part is delayed from the sample value by prescribed symbols on the time axis, a subtraction part for subtracting a third sample value shifting from the output of the arithmetic part by one symbol oppositely to a second sample value from the second sample value shifting from the output of the arithmetic part by one symbol on the time axis, a multiplication part for multiplying the output of the arithmetic part by that of the subtraction part, and a low-pass filter for passing the low frequency component of the output of the multiplication part, and a phase of the sampling clock in the clock generation part is changed by the output of the low-pass filter.

According to the present invention, as hereinabove described, the correlation value is calculated with only the sample value which is sampled at the symbol rate, whereby no information other than a sampling point is required but the circuit can be driven at the symbol rate. Further, the correlation value expresses an error signal of the timing, and the sampling timing is changed by the error signal, whereby a base band signal is sampled at the optimum timing with no employment of a phase shift part of the clock.

According to each of the first to thirteenth aspects of the present invention, no information other than the sampling point is required but the circuit can be driven at the symbol rate, whereby the symbol rate can be increased toward the upper limit value which is decided by hardware. Further, the base band signal can be sampled at the optimum timing with no employment of the phase shift part of the clock, whereby no phase adjustment is required and the adjustment cost can be reduced.

According to the second, eighth or ninth aspect of the present invention, the first correlation value (the correlation value between the sample value and the data (estimate value) precedent thereto) and the second correlation value (the correlation value between the sample value and the estimate value subsequent thereto) are so obtained that the point of time for sampling the input signal is adjusted according to the polarity of the difference between these two correlation values, whereby the position of the sampling clock can be correctly controlled even if the transmission symbol is not completely at random.

According to the third or tenth aspect of the present invention, the point of time for sampling the input signal is adjusted through the correlation between an error included in the input signal and data adjacent thereto, whereby the position of the sampling clock can be more correctly controlled.

According to the fourth or eleventh aspect of the present invention, the point of time for sampling the input signal is adjusted through the correlation between an error included in the input signal and the data precedently and subsequently adjacent thereto, whereby the position of the sampling clock can be more correctly controlled even if the transmission symbol is not completely at random.

According to the fifth or twelfth aspect of the present invention, the point of time for sampling the input signal is adjusted through the correlation between an error included in the input signal and the sample value of the input signal adjacent thereto, whereby the relation between the correlation value and the sampling clock shift is maintained even if carrier reproduction of a carrier transmission system is so incomplete that the base band signal is mixed with another base band signal, and hence the position of the sampling clock can be correctly controlled.

According to the sixth or thirteenth aspect of the present invention, the point of time for sampling the input signal is adjusted through the correlation between an error included in the input signal and the sample values of the input signals precedently and subsequently adjacent thereto, whereby the position of the sampling clock can be correctly controlled even if the transmission symbol is not completely at random and carrier reproduction of a carrier transmission system is so incomplete that the base band signal is mixed with another base band signal.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing the structure of a data reproducing unit according to a first embodiment of the present invention;

FIG. 2 is a block diagram showing the structure of a data transmission system from a modulation part to a demodulation part, which is arranged in front of the data reproducing unit;

DESCRIPTION OF THE PREFERRED EMBODIMENTS

(First Embodiment)

Figures 3A, 3B, 3C:
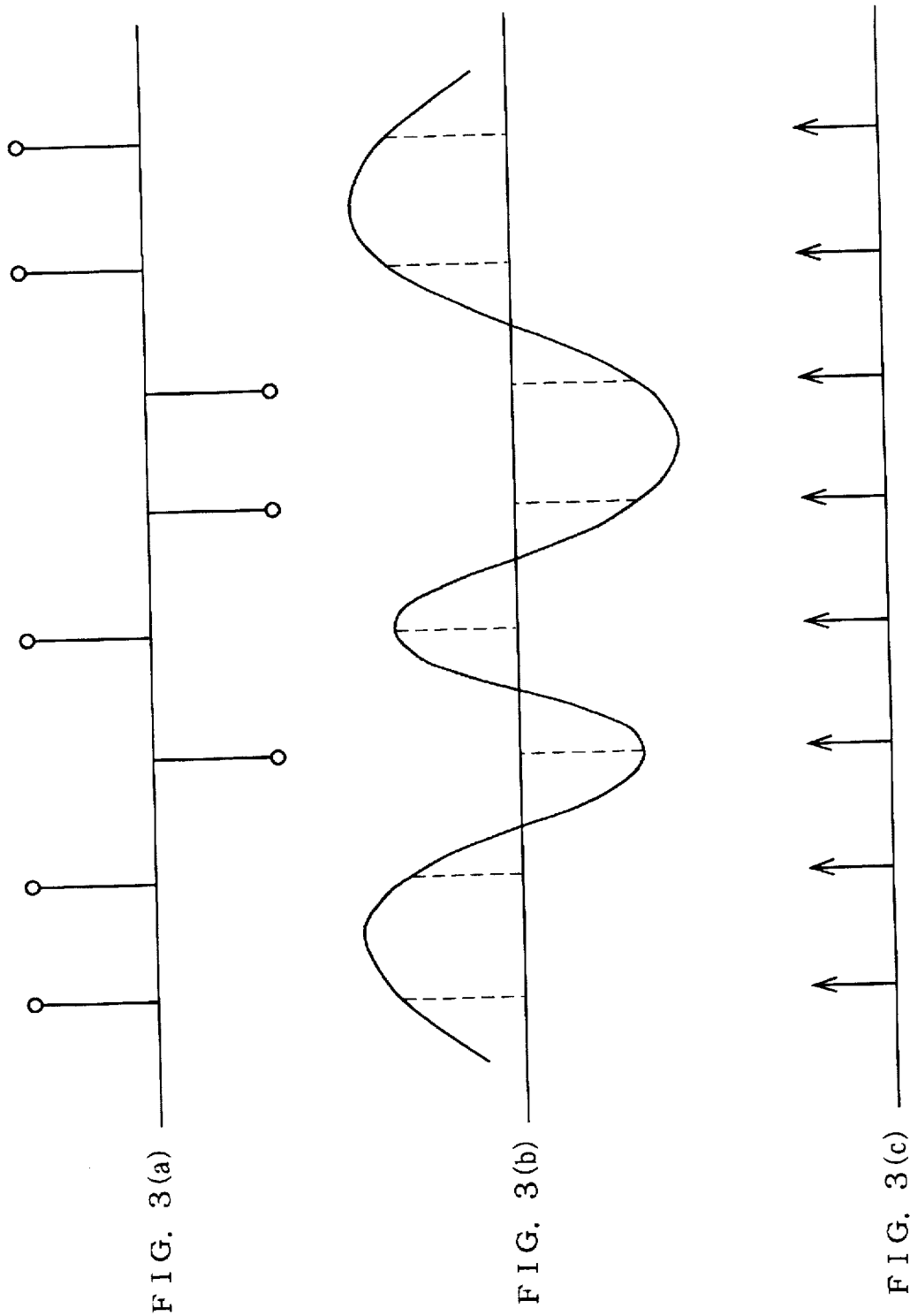
FIGS. 3(a) to 3(c) are waveform diagrams of signals from respective parts in the data transmission system shown in FIG. 2.

FIG. 1 is a block diagram showing the structure of a data reproducing unit according to a first embodiment of the present invention. FIG. 2 is a block diagram showing the structure of a data transmission system from a modulation part 31 to a demodulation part 33, which is arranged in front of the data reproducing unit shown in FIG. 1. FIGS. 3(a) to 3(c) are waveform diagrams of signals from respective parts in FIG. 2.

Transmission symbols (see FIG. 3(a)) which are inputted in the modulation part 31 in FIG. 2 are converted to a continuous waveform through band limitation of the modulation part 31, then transmitted through a transmission line 32, subjected to receiving-side band limitation in the demodulation part 33, and supplied to the data reproducing unit shown in FIG. 1. When a signal of a base band width is passed through the transmission line 32, the modulation part 31 and the demodulation part 33 handle only the signal of the base band width. When a signal of a carrier band width is passed through the transmission line 32, on the other hand, the modulation part 31 performs conversion from the base band width to the carrier band width, while the demodulation part 32 performs the conversion vice versa.

Figure 4:
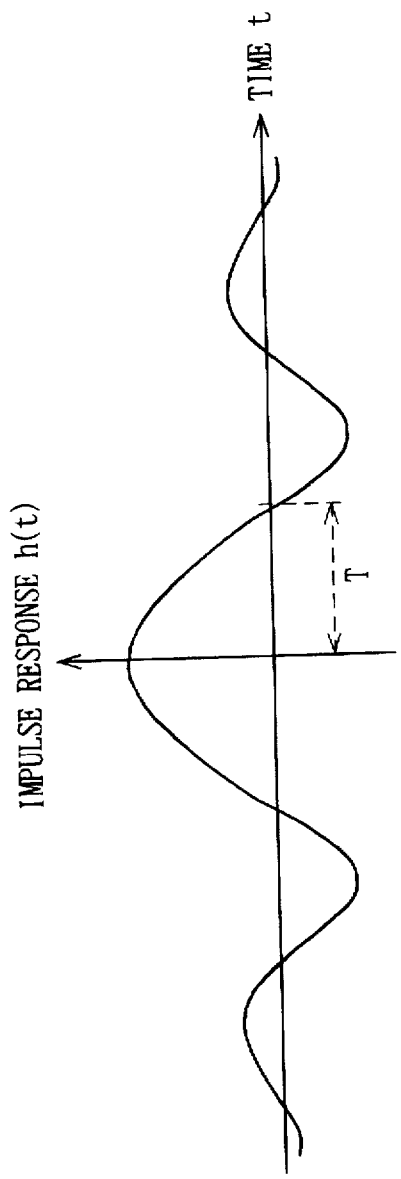
FIG. 4 illustrates impulse response of total transmission characteristics.

In general, total transmission characteristics of the modulation part 31, the transmission line 32 and the demodulation part 33 have impulse response of a full roll-off filter illustrated in FIG. 4, and hence the output of the demodulation part 33 has a continuous waveform shown in FIG. 3(b). Data can be correctly reproduced by sampling this continuous waveform in synchronization with a clock (see FIG. 3(c)) having the same timing as the transmission symbol which is inputted in the modulation part 31. For the purpose of simplification, time differences upon passage through the modulation part 31, the transmission part 32 and the demodulation part 33 are neglected.

Referring to FIG. 1, the data reproducing unit according to this embodiment comprises a sampler 1, a decision circuit 2, a delay circuit 3, a multiplier 4, a low-pass filter 5, and a voltage controlled oscillator 6.

The sampler 1 samples an inputted base band signal in accordance with a sampling clock which is supplied from the voltage controlled oscillator 6, and outputs a sample value $S_n$. The decision circuit 2 determines the sample value $S_n$, and outputs data $d_n$ which is an estimate value of the transmission symbol. The delay circuit 3 delays the data $d_n$ by one sampling clock, and outputs data $d_{n-1}$. The multiplier 4 multiplies the sample value $S_n$ by the delayed data $d_{n-1}$. The low-pass filter 5 smoothes the output of the multiplier 4, and extracts its dc component. The voltage controlled oscillator 6 generates the sampling clock having a changeable frequency according to the sign and the magnitude of the dc component.

The reason why the base band signal can be sampled at the optimum timing through the structure shown in FIG. 1 is now described in detail.

Figure 5:
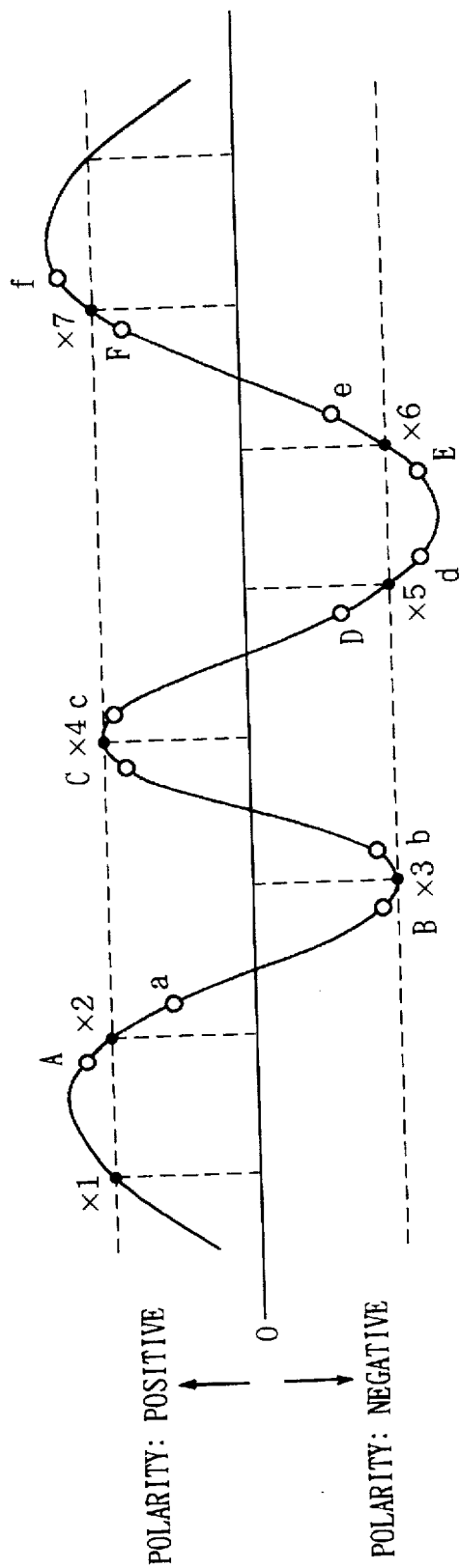
FIG. 5 is adapted to illustrate states of sample values upon shift of a sampling clock from the optimum position.

Referring to FIGS. 3(a) to 3(c), the sampling clock is at the optimum position. On the other hand, FIG. 5 shows sample values upon shift of a sampling clock from the optimum position. When the sampling clock shifts forwardly on the time axis in FIG. 5, sample values A and D are larger than the original values in FIG. 3(b). This is because data X1 and X4 which are precedent to A and D are positive in polarity and sampling timings approach the precedent data so that the response from the precedent data is positive similarly to the polarity thereof. At E and F, on the other hand, the response from precedent data X5 and X6 is negative similarly to the polarity thereof, and hence the sample values are smaller than the original values.

When the sampling clock shifts backwardly on the time axis in FIG. 5, on the other hand, sample values a and d are smaller than the original values in FIG. 3(b). This is because the data X1 and X4 which are precedent to a and d are positive in polarity and the sampling timings are separated from the precedent data, so that the response from the precedent is negative reversely to the polarity thereof. At e and f, on the other hand, the response from the precedent data X5 and X6 is positive reversely to the polarity thereof, and hence the sample values are larger than the original values.

Sample values B and C which shift forwardly on the time axis, and b and c which shift backwardly on the time axis only slightly shift from the original values. This is because the response from the precedent data and that from the subsequent data cancel with each other. Considering the response from the precedent data alone, the correlation between the sample value and the data precedent thereto is positive when the sampling timing shifts forwardly on the time axis, as hereinabove described. When the sampling timing shifts backwardly on the time axis, on the other hand, the correlation between the sample value and the data precedent thereto is negative. On the basis of the above description, the reason why the sampling timing is optimized in the data reproducing unit shown in FIG. 1 is now described.

The multiplier 4 multiplies sample values by data which are precedent thereto, and the low-pass filter 5 approximately accumulates the results of such multiplication, thereby outputting correlation values thereof in consequence. The voltage controlled oscillator 6 has such characteristics that the frequency is reduced when the control voltage is increased, and vice versa. When a sampling timing is premature, the correlation is positive and hence the control voltage is increased while the sampling frequency is reduced. Consequently, the sampling timing is delayed. When the sampling timing is late, on the other hand, the correlation is negative, and hence the control voltage is reduced while the sampling frequency is increased. Consequently, the sampling timing is brought forward. Thus, the sampling timing is controlled so that the correlation is zero, thereby achieving sampling at the optimum time.

It will be now confirmed that the sign and the magnitude of the correlation value indicate the direction and the magnitude of timing shift with equations.

The sample value $S_n$ among those shown in FIG. 5 is expressed in the following equation (1):

$$S_n = k\{a_{n+1} h(t-T) + a_n h(t) + a_{n-1}(t+T)\} \quad (1)$$

where k represents the total amplitude gain of the modulation part 31, the transmission part 32 and the demodulation part 33, h( ) represents the impulse response of the total transmission characteristics of the modulation part 31, the transmission part 32 and the demodulation part 33, an represents data transmitted from the modulation part, $a_{n+1}$, represents data which is subsequent thereto, $a_{n-1}$ n represents data which is precedent thereto, t represents a shifted time from the optimum sampling timing, and T represents one symbol length.

When sampling is carried out at the optimum timing, the response of adjacent data corresponds to a zero point (a point separated from the center by ±1 symbol) in the impulse response shown in FIG. 4, and hence no interference is caused between the data. Interference from the adjacent data is increased with shift from the optimum timing. This state is obtained from the above equation (1). Referring to the above equation (1), h(t−T) and h(t+T) can be approximated in the following equations (2) and (3) respectively:

$$h(t-T) = h(-T) + h'(-T)t \quad (2)$$
$$= ct$$

$$h(t+T) = h(T) + h'(T)t \quad (3)$$
$$= -ct$$

where h'( ) represents primary differentiation of h( ), and c represents the absolute value of a primary differential value at a point of time forwardly or backwardly separated from the center of the impulse response by one symbol length.

In the above equation (1), h(t), which is the maximal part of the impulse response, is approximated to h(t)=1, regardless of t. Due to such approximation, $S_n$ in the equation (1) is expressed in the following equation (4):

$$S_n = k\{a_n + c(a_{n+1} - a_{n-1})t\} \quad (4)$$

The decision circuit 2 outputs the decision value $d_n$ of $S_n$, and the delay circuit 3 delays the same by one sample and outputs $d_{n-1}$. The multiplier 4 multiplies $S_n$ by $d_{n-1}$, and hence its output is expressed in the following equation (5):

$$S_n d_{n-1} = k a_n d_{n-1} + kc(a_{n+1} - a_{n-1}d_{n-1})t \quad (5)$$

A timing error signal of the above equation (5) is passed through the low-pass filter 8, so that its low frequency component, i.e., an average value, is obtained. Assuming that transmitted data are at random, the relations of the following equations (6) and (7) hold, where <> represents averages:

$$<a_n d_{n-1}> = 0 \quad (6)$$

$$<a_{n+1} d_{n-1}> = 0 \quad (7)$$

With the relations of the above equations (6) and (7), the average value <e> of the above equation (5) is expressed in the following equation (8):

$$<e> = -kc<a_{n-1}d_{n-1}>t \quad (8)$$
$$= -kc<a_n d_n>t$$

The correlation between $a_n$ and $d_n$ is large and $<a_n d_n>$ in the above equation (8) takes a positive value unless the number of determination errors is extremely large, whereby <e> reflects the sign and the magnitude of the shifted time t.

While the correlation between the sample value and the data precedent thereto is obtained in the embodiment shown in FIG. 1, the sample value may alternatively be delayed for obtaining the correlation between the sample value and data which is subsequent thereto. In this case, the control voltage is reduced when the sampling timing is premature since the correlation is negative, while the control voltage is increased when the sampling timing is late since the correlation is positive. Therefore, sampling at the optimum time is realized by providing the voltage controlled oscillator 6 with such characteristics that the frequency is increased when the control voltage is increased, and vice versa.

(Second Embodiment)

Figure 6:
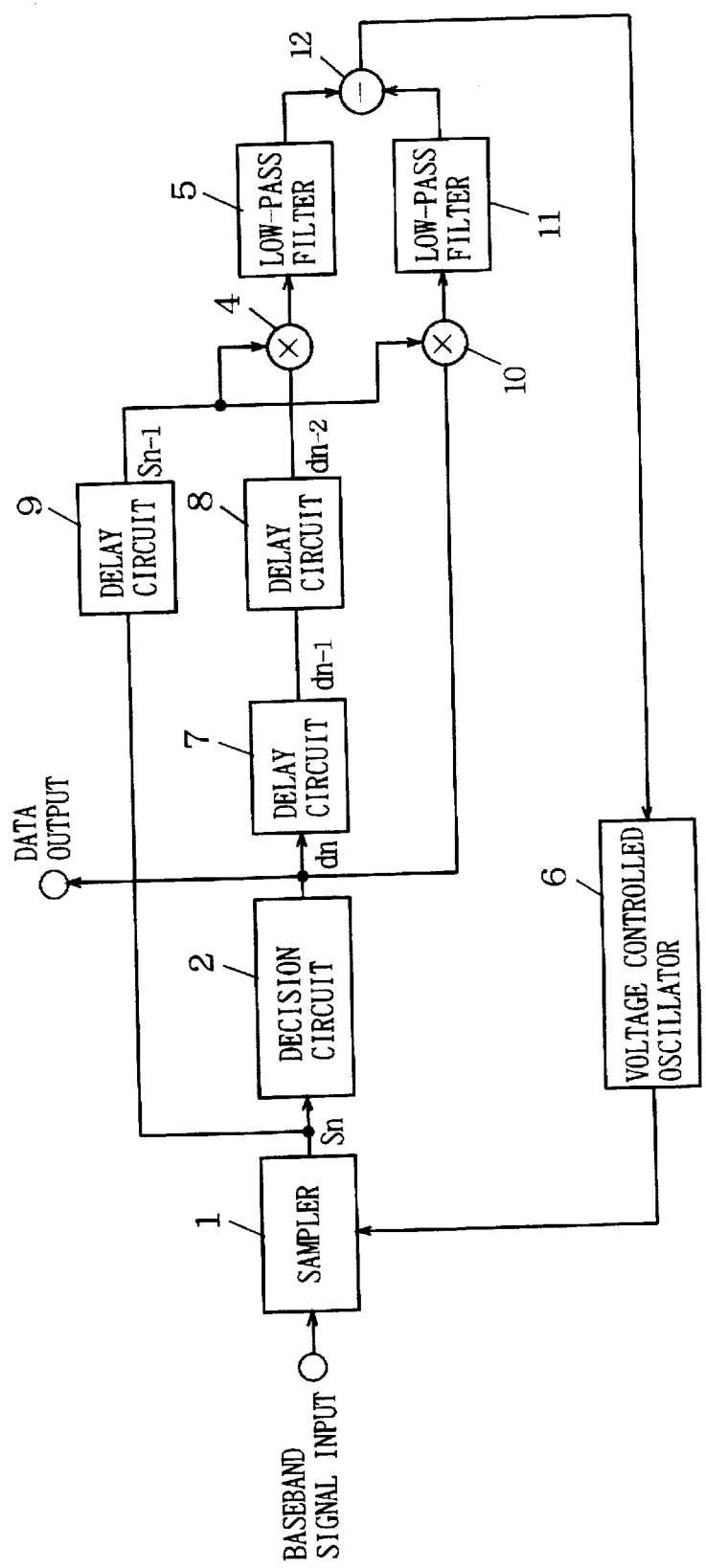
FIG. 6 is a block diagram showing the structure of a data reproducing unit according to a second embodiment of the present invention.

FIG. 6 is a block diagram showing the structure of a data reproducing unit according to a second embodiment of the present invention. In the aforementioned first embodiment, the equation (8) does not completely hold when the transmission symbol is not completely at random and the condition $<a_n d_{n-1}> = 0$ of the equation (6) does not hold. The embodiment shown in FIG. 6 is formed as a data reproducing unit corresponding to a transmission symbol which is not completely at random.

Referring to FIG. 6, this data reproducing unit comprises a sampler 1, a decision circuit 2, multipliers 4 and 10, low-pass filters 5 and 11, a voltage controlled oscillator 6, delay circuits 7 to 9, and a subtracter 12.

The sampler 1 samples an inputted base band signal in accordance with a sampling clock which is supplied from the voltage controlled oscillator 6, and outputs a sample value $S_n$. The decision circuit 2 determines the sample value $S_n$, and outputs data $d_n$ which is an estimate value of the transmission symbol. The delay circuit 7 delays the data $d_n$ by one sampling clock, and outputs data $d_{n-1}$. The delay circuit 8 delays the data $d_{n-1}$ by one sampling clock, and outputs data $d_{n-2}$. The delay circuit 9 delays the sample value $S_n$ by one sampling clock, and outputs a sample value $S_{n-1}$. The multiplier 4 multiplies the sample value $S_{n-1}$ by the data $d_{n-2}$. The low-pass filter 5 smoothes the output of the multiplier 4, and extracts its dc component. The multiplier 10 multiplies the sample value $S_{n-1}$ by the data $d_n$. The low-pass filter 11 smoothes the output of the multiplier 10, and extracts its dc component. The subtracter 12 subtracts the dc component outputted from the low-pass filter 11 from that outputted from the low-pass filter 5. The voltage controlled oscillator 6 generates the sampling clock having a changeable frequency according to the sign and the magnitude of the output signal from the subtracter 12.

The reason why the base band signal can be sampled at the optimum timing by the structure shown in FIG. 6 is now described in detail. With reference to the first embodiment, it has been described that the correlation between the sample value and the data which is precedent thereto is positive when the sampling timing shifts forwardly on the time axis and vice versa. Similarly, it can be inferred that the correlation between the sample value and data which is subsequent thereto is negative when the sampling timing shifts forwardly on the time axis, and vice versa. The subtracter 12 subtracts the correlation between a sample value and data subsequent thereto from that between the sample value and data precedent thereto, whereby its output is positive when the sampling timing shifts forwardly, and vice versa. The voltage controlled oscillator 6 is controlled by the output of the subtracter 12, whereby sampling at the optimum time can be implemented similarly to the first embodiment. Further, the voltage controlled oscillator 6 can be more correctly controlled, due to the difference between two correlation values.

(Third Embodiment)

All of the multipliers 4 and 5, the low-pass filters 5 and 11 and the subtracter 12 shown in FIG. 6 perform linear processing on the data $d_{n-2}$ and $d_n$. Alternatively, the subtracter may first subtract the data $d_n$ from the data $d_{n-2}$, and then a multiplier and a low-pass filter are provided. In this case, the data reproducing unit has a structure shown in FIG. 7, whereby the numbers of the multipliers and the low-pass filters can be reduced.

Figure 7:
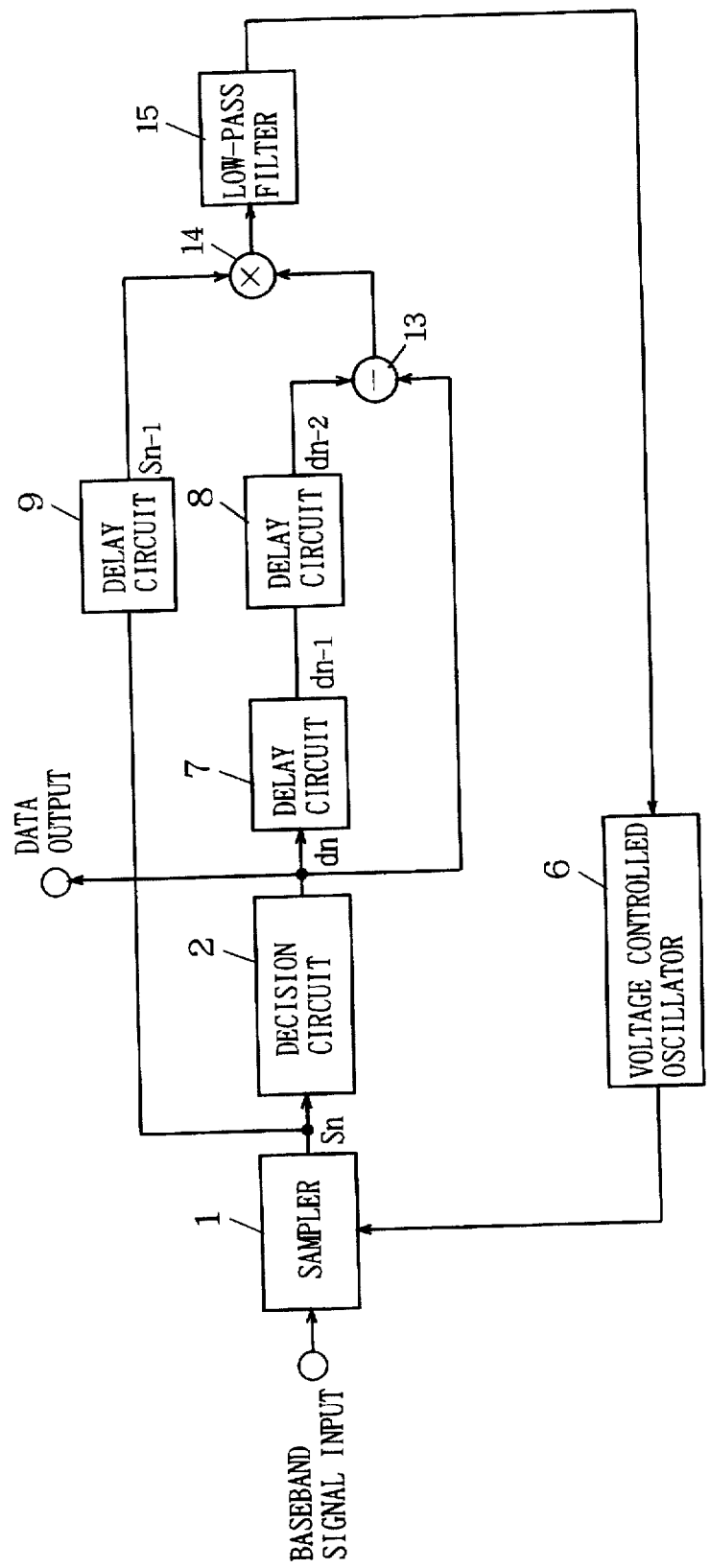
FIG. 7 is a block diagram showing the structure of a data reproducing unit according to a third embodiment of the present invention.

In a third embodiment of the present invention shown in FIG. 7, a subtracter 13 subtracts data $d_n$ from data $d_{n-2}$. A multiplier 14 multiplies the output of the subtracter 13 by a sample value $S_{n-1}$. It will be confirmed with equations that the voltage controlled oscillator 6 can be more correctly controlled with the structure shown in FIG. 7 as compared with the first embodiment.

Similarly to the derivation of the above equation (4), the sample value $S_{n-1}$ is expressed in the following equation (9):

$$S_{n-1}=k\{a_{n-1}+c(a_n-a_{n-2})t\} \qquad (9)$$

The multiplier 14 multiplies this sample value $S_{n-1}$ by the data difference $(d_{n-2}-d_n)$, and hence its output is expressed in the following equation (10):

$$S_{n-1}(d_{n-2}-d_n) = ka_{n-1}(d_{n-2}-d_n) - \qquad (10)$$
$$kc(a_nd_n + a_{n-2}d_{n-2} - a_nd_{n-2} - a_{n-2}d_n)t$$

A timing error signal of the above equation (10) is passed through a low-pass filter 15, so that its low frequency component, i.e., an average value, is obtained. Even if the transmitted data are not completely at random, the relations of the following equations (11) and (12) hold:

$$<a_{n-1}d_{n-2}>=<a_{n-1}d_n> \qquad (11)$$

$$<a_nd_n>=<a_{n-2}d_{n-2}>>><a_nd_{n-2}>=<a_{n-2}d_n> \qquad (12)$$

With the relations of the above equations (11) and (12), the average value $<e>$ of the equation (10) is expressed in the following equation (13):

$$<e>=-2kc<a_nd_n>t \qquad (13)$$

The correlation between $a_n$ and $d_n$ is large and $<a_nd_n>$ in the equation (13) takes a positive value unless the number of determination errors is extremely large, $<e>$ reflects the sign and the magnitude of the shifted time t.

(Fourth Embodiment)

In each of the first to third embodiments, the position of the sampling clock is controlled through the correlation between the sample value of the base band signal and the data adjacent thereto. When the correlation between an error included in a base band signal and data adjacent thereto is utilized, on the other hand, the position of the sampling clock can be more correctly controlled.

Figure 8:
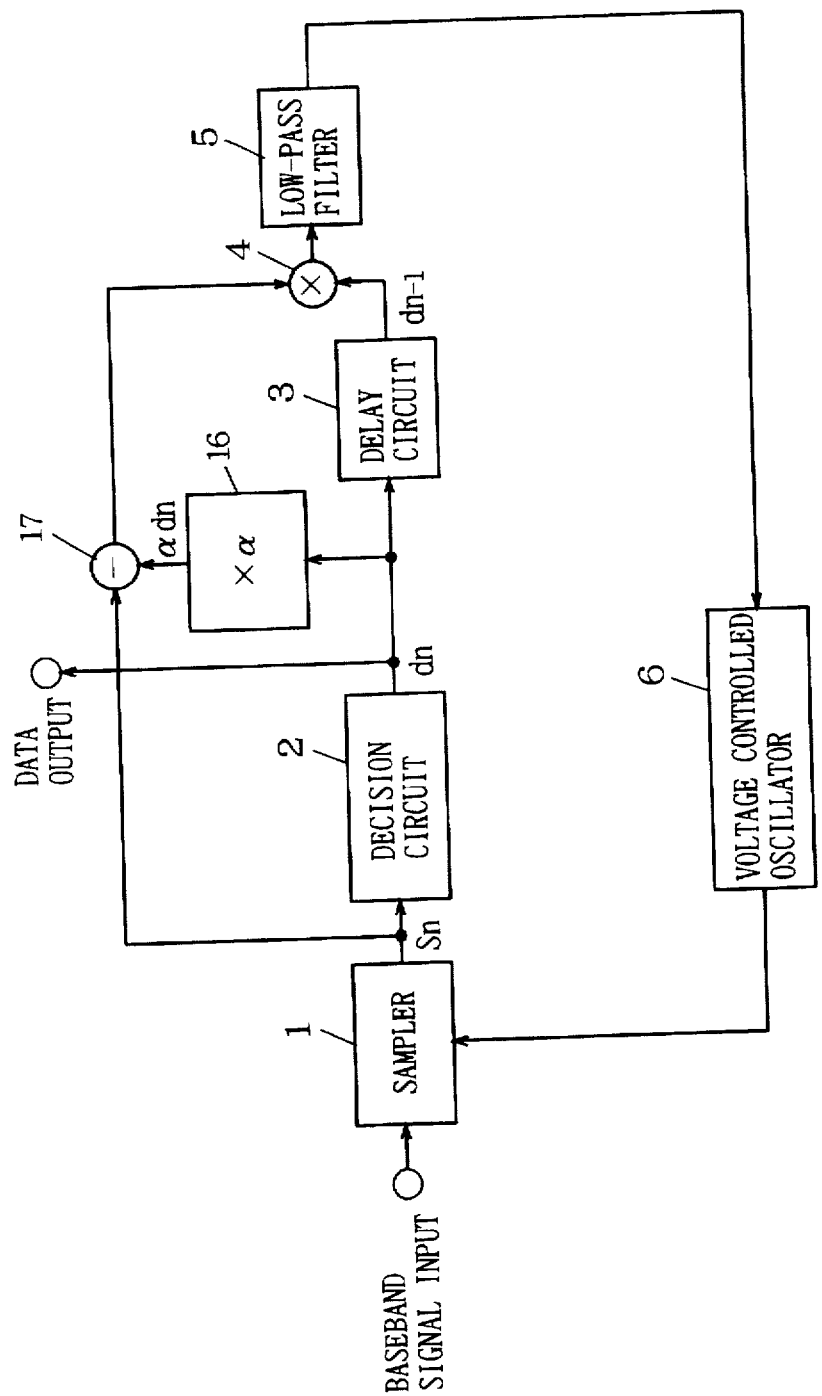
FIG. 8 is a block diagram showing the structure of a data reproducing unit according to a fourth embodiment of the present invention.

FIG. 8 is a block diagram showing the structure of a data reproducing unit according to a fourth embodiment of the present invention. Referring to FIG. 8, this data reproducing unit comprises a sampler 1, a decision circuit 2, a delay circuit 3, a multiplier 4, a low-pass filter 5, a voltage controlled oscillator 6, a constant multiplier 16, and a subtracter 17.

The sampler 1 samples an inputted base band signal in accordance with a sampling clock which is supplied from the voltage controlled oscillator 6, and outputs a sample value $S_n$. The decision circuit 2 determines the sample value $S_n$, and outputs data $d_n$ which is an estimate value of the transmission symbol. The delay circuit 3 delays the data $d_n$ by one sampling clock, and outputs data $d_{n-1}$. The constant multiplier 16 multiplies the data $d_n$ by a constant $\alpha$, and outputs $\alpha d_n$. The subtracter 17 subtracts $\alpha d_n$ from the sample value $S_n$. The multiplier 4 multiplies the output of the subtracter 17 by the delayed data $d_{n-1}$. The low-pass filter smoothes the output of the multiplier 4, and extracts its dc component. The voltage controlled oscillator 6 generates the sampling clock having a changeable frequency, according to the sign and the magnitude of the dc component.

The reason why the base band signal can be sampled at the optimum timing with the structure shown in FIG. 8 is now described in detail. The basic structure is identical to the structure shown in FIG. 1 illustrated with reference to the first embodiment, and hence a part different from this structure is described with an equation.

The subtracter 17 subtracts $\alpha d_n$ from the sample value $S_n$ while the multiplier 4 multiplies the output of the subtracter 17 by the delayed data $d_{n-1}$, and hence the output of the multiplier 17 is expressed in the following equation (14):

$$(S_n - \alpha d_n)d_{n-1} = (ka_n - \alpha d_n)d_{n-1} + \qquad (14)$$
$$kc(a_{n+1}d_{n-1} - a_{n-1}d_{n-1})t$$

The correlation value outputted from the low-pass filter 5 is expressed in the equation (8), similarly to the first embodiment. Comparing the equation (14) with the equation (5) of the first embodiment, the term $ka_nd_{n-1}$ is replaced with $(ka_n-\alpha d_n)d_{n-1}$. This term, which is irrelevant to the shifted time t of the sampling timing, is preferably minimized, in order to detect the shifted time for employing the same for control. Unless the number of determination errors is extremely large, $d_n$ may be regarded as being equal to $a_n$, and hence the absolute value of this term can be reduced by selecting the multiplication constant a at a value which is close to the total gain k.

(Fifth Embodiment)

Figure 9:
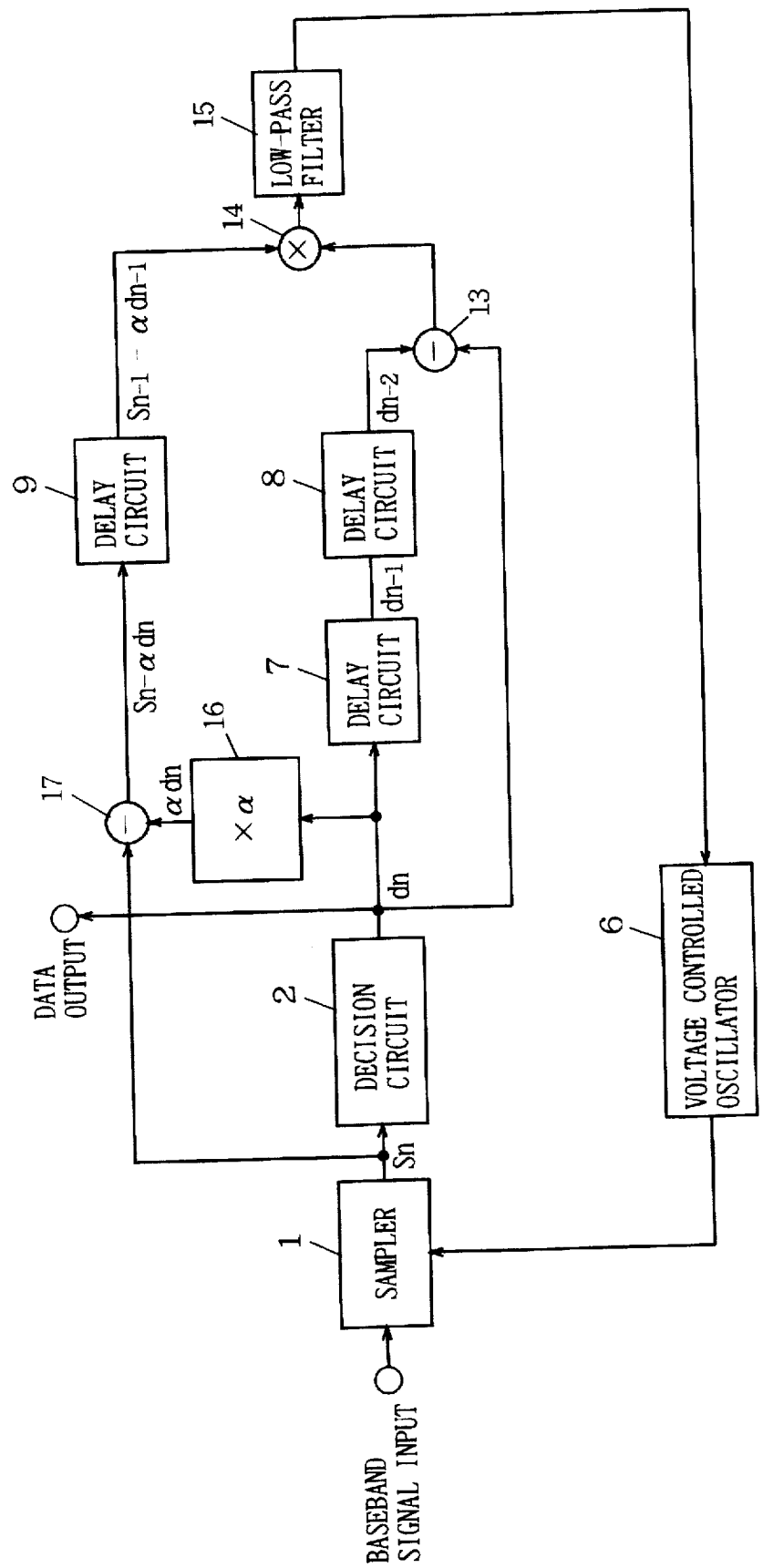
FIG. 9 is a block diagram showing the structure of a data reproducing unit according to a fifth embodiment of the present invention.

FIG. 9 is a block diagram showing the structure of a data reproducing unit according to a fifth embodiment of the present invention. Referring to FIG. 9, this data reproducing unit comprises a sampler 1, a decision circuit 2, a voltage controlled oscillator 6, delay circuits 7 to 9, a subtracter 13, a multiplier 14, a low-pass filter 15, a constant multiplier 16, and a subtracter 17.

The sampler 1 samples an inputted base band signal in accordance with a sampling clock which is supplied from the voltage controlled oscillator 6, and outputs a sample value $S_n$. The decision circuit 2 determines the sample value $S_n$, and outputs data $d_n$ which is an estimate value of the transmission symbol. The delay circuit 7 delays the data $d_n$ by one sampling clock, and outputs data $d_{n-1}$. The delay circuit 8 delays the data $d_{n-1}$ by one sampling clock, and outputs data $d_{n-2}$. The subtracter 13 subtracts the data $d_n$ from the data $d_{n-2}$, and outputs $d_{n-2}-d_n$. The constant multiplier 16 multiplies the data $d_n$ by a constant $\alpha$, and outputs $\alpha d_n$. The subtracter 17 subtracts $\alpha d_n$ from the sample value $S_n$, and outputs $S_n-\alpha d_n$. The delay circuit 9 delays $S_n-\alpha d_n$ by one sampling clock, and outputs $S_{n-1}-\alpha d_{n-1}$. The multiplier 14 multiplies $S_{n-1}-\alpha d_{n-1}$ by $d_{n-2}-d_n$. The low-pass filter 15 smoothes the output of the multiplier 14, and extracts its dc component. The voltage controlled oscillator 6 generates the sampling clock having a changeable frequency, according to the sign and the magnitude of the dc component.

The reason why the base band signal can be sampled at the optimum timing by the structure shown in FIG. 9 is now described in detail. The basic structure is identical to that shown in FIG. 7 illustrated with reference to the third embodiment, and hence a different part is described with an equation.

The output of the multiplier 14, which multiplies $S_{n-1}-\alpha d_{n-1}$ by $d_{n-2}-d_n$, is expressed in the following equation (15):

$$(S_{n-1} - \alpha d_{n-1})(d_{n-2} - d_n) = \quad (15)$$
$$(ka_{n-1} - \alpha d_{n-1})(d_{n-2} - d_n) -$$
$$kc(a_n d_n + a_{n-2} d_{n-2} - a_n d_{n-2} - a_{n-2} d_n)t$$

The correlation value outputted from the low-pass filter 15 is expressed in the equation (13), similarly to the third embodiment.

Comparing the equation (15) with the above equation (10) of the third embodiment, the term $ka_{n-1}(d_{n-2}-d_n)$ is replaced with $(ka_{n-1}\alpha d_{n-1})(d_{n-2}-d_n)$. This term, which is irrelevant to the shifted time t of the sampling timing, is preferably minimized in order to detect the shifted time and employ the same for control. Unless the number of determination errors is extremely large, $d_n$ may be regarded as being equal to $a_n$, and hence the absolute value of this term can be reduced by selecting the multiplication constant $\alpha$ at a value which is close to the total gain k.

(Sixth Embodiment)

Each of the fourth and fifth embodiments is adapted to control the position of the sampling clock through the correlation between an error included in the base band signal and data adjacent thereto. Alternatively, the correlation between an error included in a base band signal and a sample value of a base band signal which is adjacent thereto can be utilized. Thus, the relation between the correlation value and sampling clock shift is maintained even if carrier reproduction of a carrier transmission system is so incomplete that the base band signal is mixed with another base band signal, whereby the position of the sampling clock can be correctly controlled.

Figure 10:
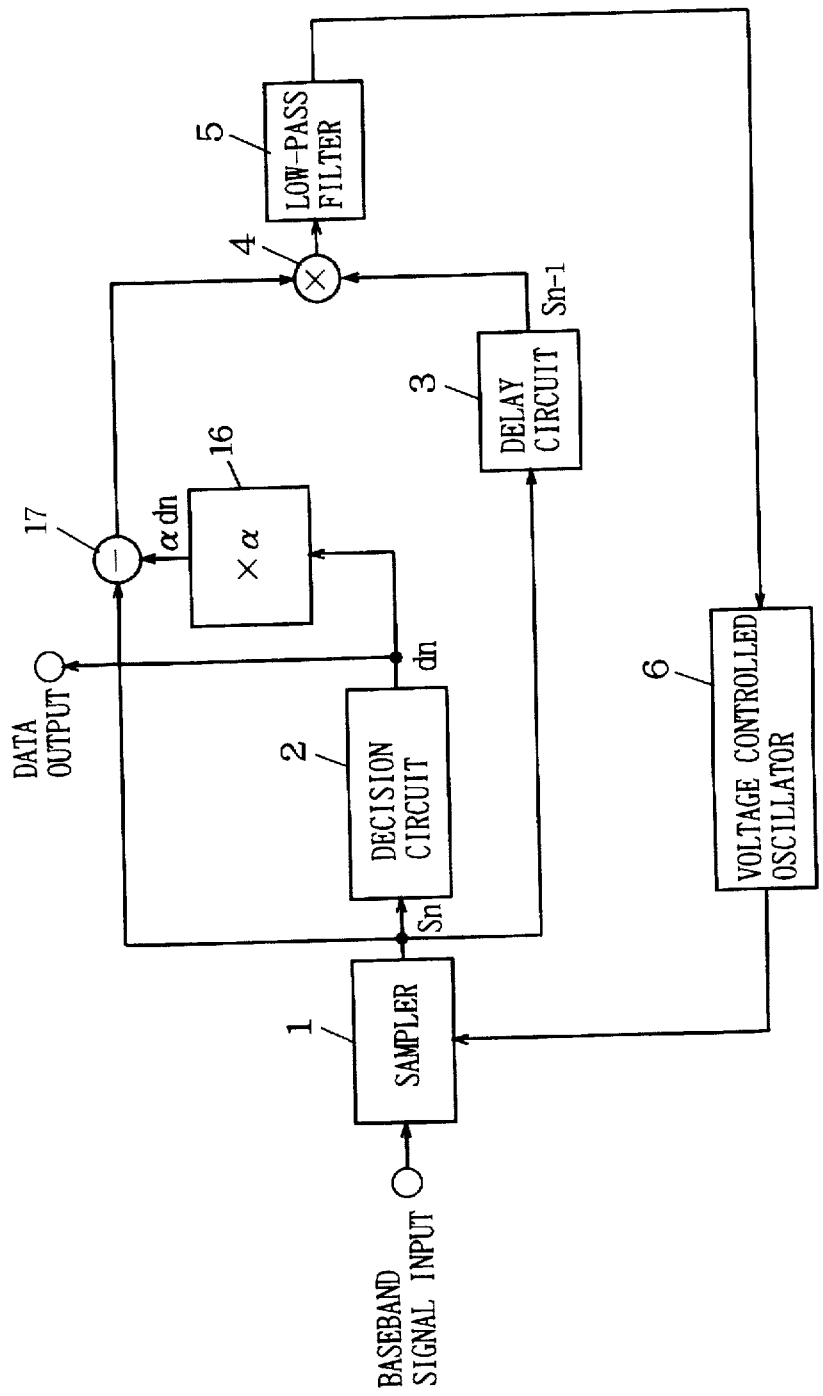
FIG. 10 is a block diagram showing the structure of a data reproducing unit according to a sixth embodiment of the present invention.

FIG. 10 is a block diagram showing the structure of a data reproducing unit according to a sixth embodiment of the present invention. Referring to FIG. 10, this data reproducing unit comprises a sampler 1, a decision circuit 2, a delay circuit 3, a multiplier 4, a low-pass filter 5, a voltage controlled oscillator 6, a constant multiplier 16, and a subtracter 17.

The sampler 1 samples an inputted base band signal in accordance with a sampling clock which is supplied from the voltage controlled oscillator 6, and outputs a sample value $S_n$. The decision circuit 2 determines the sample value $S_n$, and outputs data $d_n$ which is an estimate value of the transmission symbol. The constant multiplier 16 multiplies the data $d_n$ by a constant $\alpha$, and outputs $\alpha d_n$. The subtracter 17 subtracts $\alpha d_n$ from the sample value $S_n$. The delay circuit 3 delays the sample value $S_n$ by one sampling clock, and outputs a sample value $S_{n-1}$. The multiplier 4 multiplies the output of the subtracter 17 by the delayed sample value $S_{n-1}$. The low-pass filter 5 smoothes the output of the multiplier 4, and extracts its dc component. The voltage controlled oscillator 6 generates the sampling clock having a changeable frequency, according to the sign and the magnitude of the dc component.

The reason why the base band signal can be sampled at the optimum timing by the structure shown in FIG. 10 is now described in detail. The basic structure is identical to that shown in FIG. 8 illustrated with reference to the fourth embodiment except that the data inputted in the multiplier is replaced with a sample value, and hence the correlation value outputted from the low-pass filter 5 is similar to that of the above equation (8), and expressed in the following equation (16):

$$<e> = -k^2 c<a_n^2>t \quad (16)$$

Thus, it is understood that the equation (16) reflects the sign and the magnitude of the shifted time t.

(Seventh Embodiment)

Figure 11:
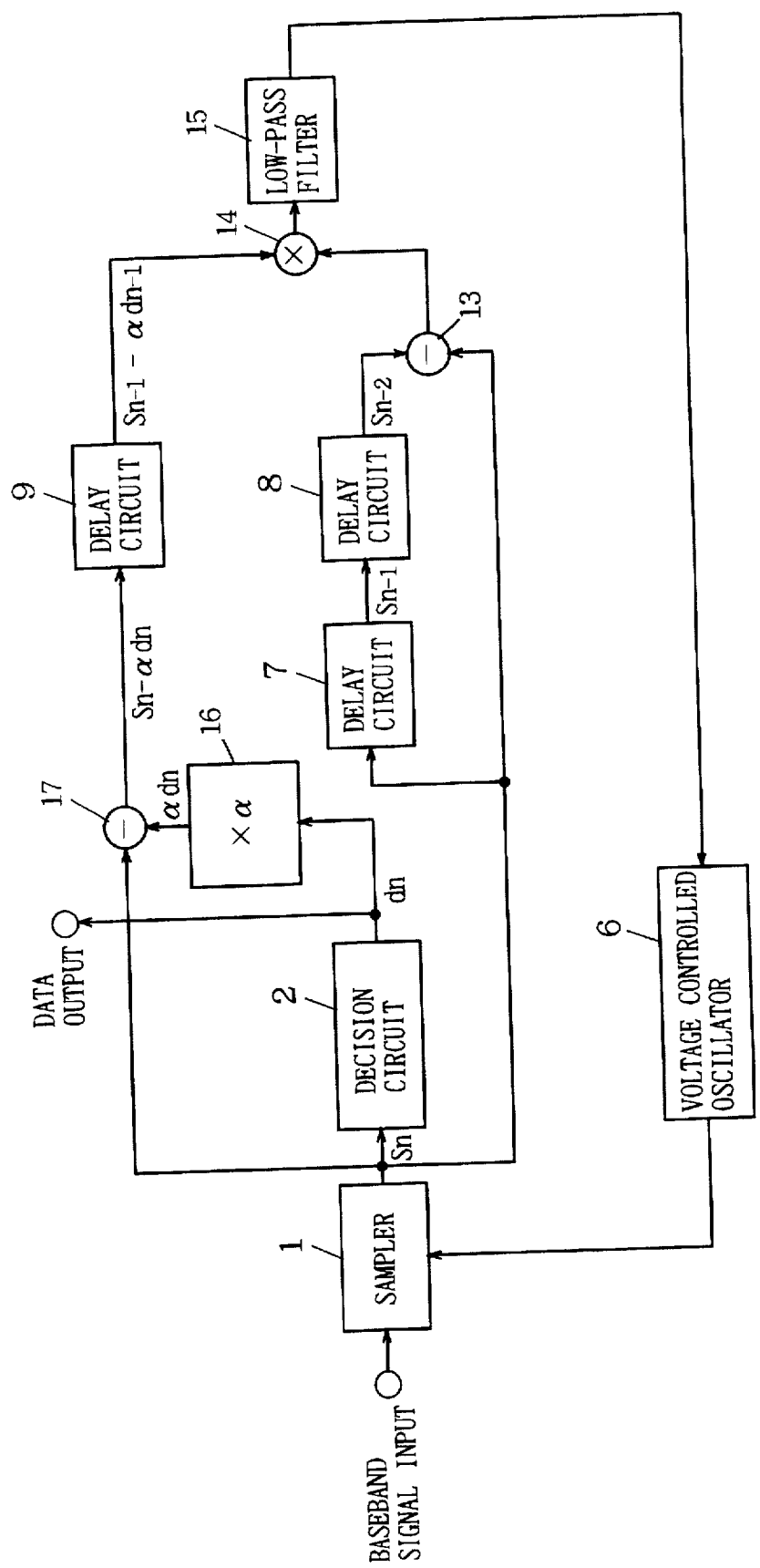
FIG. 11 is a block diagram showing the structure of a data reproducing unit according to a seventh embodiment of the present invention.

FIG. 11 is a block diagram showing the structure of a data reproducing unit according to a seventh embodiment of the present invention. Referring to FIG. 11, this data reproducing unit comprises a sampler 1, a decision circuit 2, a voltage controlled oscillator 6, delay circuits 7 to 9, a subtracter 13, a multiplier 14, a low-pass filter 15, a constant multiplier 16, and a subtracter 17.

The sampler 1 samples an inputted base band signal in accordance with a sampling clock which is supplied from the voltage controlled oscillator 6, and outputs a sample value $S_n$. The decision circuit 2 determines the sample value $S_n$, and outputs data $d_n$ which is an estimate value of the transmission symbol. The delay circuit 7 delays the sample value $S_n$ by one sampling clock, and outputs a sample value $S_{n-1}$. The delay circuit 8 delays the sample value $S_{n-1}$ by one sampling clock, and outputs a sample value $S_{n-2}$. The subtracter 13 subtracts the sample value $S_n$ from the sample value $S_{n-2}$, and outputs $S_{n-2}-S_n$. The constant multiplier 16 multiplies the data $d_n$ by a constant $\alpha$, and outputs $\alpha d_n$. The subtracter 17 subtracts $\alpha d_n$ from the sample value $S_n$, and outputs $S_n-\alpha d_n$. The delay circuit 9 delays $S_n-\alpha d_n$ by one sampling clock, and outputs $S_{n-1}-\alpha d_{n-1}$. The multiplier 14 multiplies $S_{n-1}-\alpha d_{n-1}$ by $S_{n-2}-S_n$. The low-pass filter 15 smoothes the output of the multiplier 14, and extracts its dc component. The voltage controlled oscillator 6 generates the sampling clock having a changeable frequency, according to the sign and the magnitude of the dc component.

The reason why the base band signal can be sampled at the optimum timing by the structure shown in FIG. 11 is now described in detail. The basic structure is identical to that shown in FIG. 9 illustrated with reference to the fifth embodiment except that the data inputted in the multiplier is replaced with a sample value, and hence the correlation value outputted from the low-pass filter 15 is similar to that of the above equation (13), and expressed in the following equation (17):

$$<e> = -2k^2 c<a_n^2>t \quad (17)$$

Thus, it is understood that the equation (17) reflects the sign and the magnitude of the shifted time t.

(Eighth Embodiment)

Figure 12:
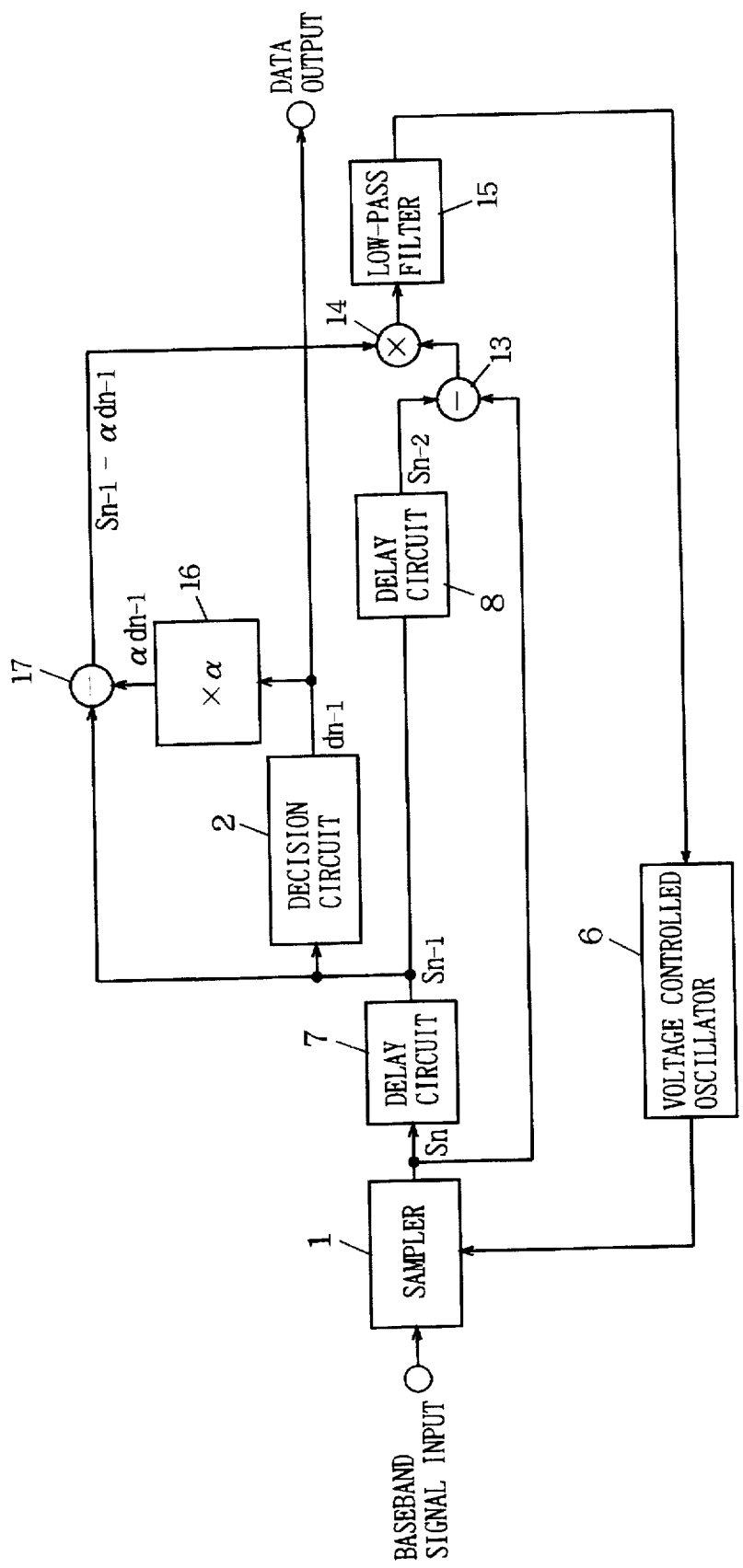
FIG. 12 is a block diagram showing the structure of a data reproducing unit according to an eighth embodiment of the present invention.

In the embodiment shown in FIG. 11, in order to obtain $S_{n-1}-\alpha d_{n-1}$ to be supplied to the multiplier 14, $S_n-\alpha d_n$ is first produced by the constant multiplier 16 and the subtracter 17, and delayed by the delay circuit 9. Alternatively, $S_{n-1}-\alpha d_{n-1}$ can be obtained by applying the constant multiplier 16 and the subtracter 17 to $S_{n-1}$ which is outputted from the delay circuit 7. FIG. 12 shows this structure as an eighth embodiment. When the structure shown in FIG. 12 is employed, the delay circuit 9 shown in FIG. 11 can be omitted.

(Ninth Embodiment)

Figure 13:
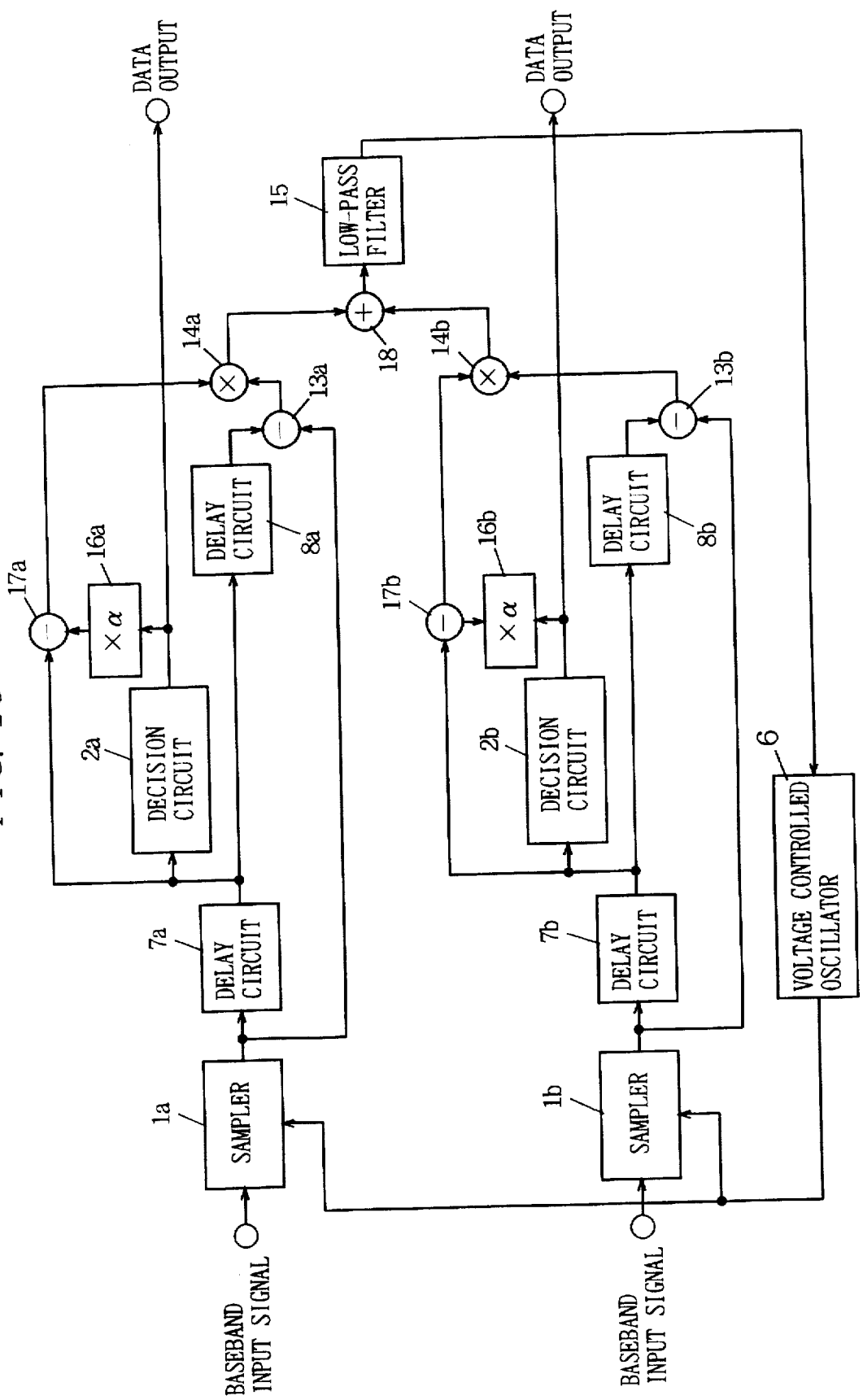
FIG. 13 is a block diagram showing the structure of a data reproducing unit according to a ninth embodiment of the present invention.
Figure 14:
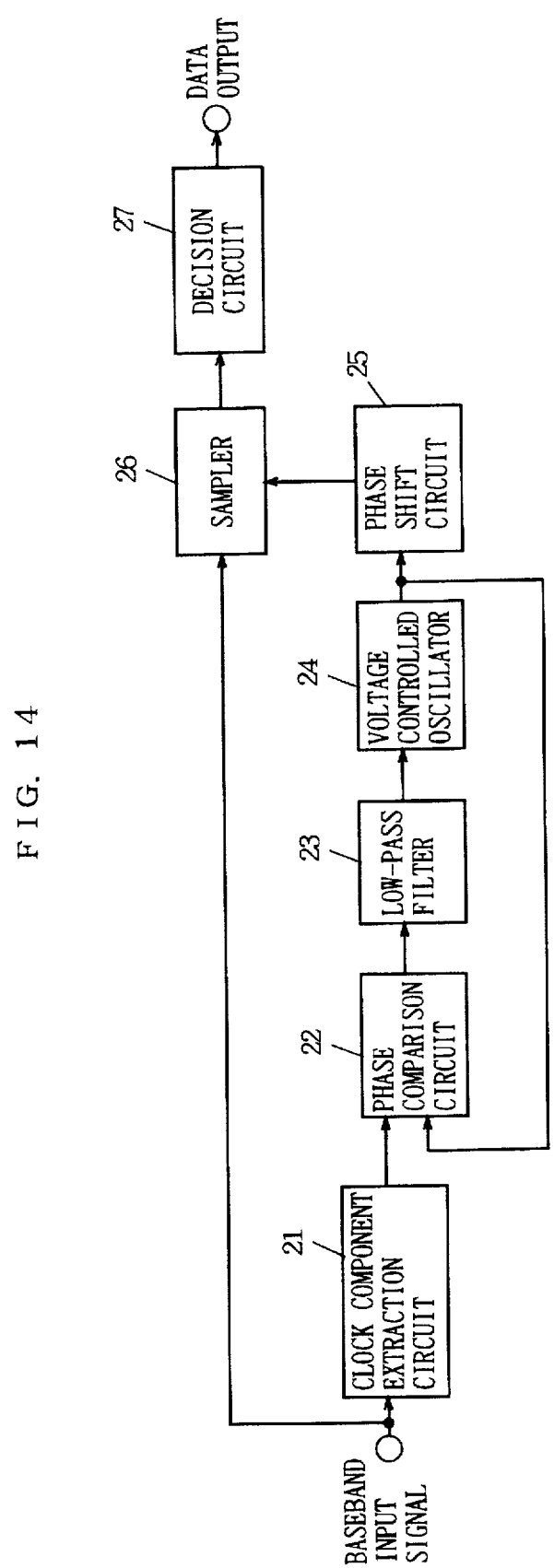
FIG. 14 is a block diagram showing the structure of a conventional data reproducing unit.

FIG. 13 is a block diagram showing the structure of a data reproducing unit according to a ninth embodiment of the present invention. In the ninth embodiment, the base band signal input of the eighth embodiment shown in FIG. 12 is extended to two.

Referring to FIG. 13, samplers 1a and 1b, decision circuits 2a and 2b, delay circuits 7a and 7b, delay circuits 8a and 8b, subtracters 13a and 13b, multipliers 14a and 14b, constant multipliers 16a and 16b and subtracters 17a and 17b are identical in structure to the sampler 1, the decision circuit 2, the delay circuit 7, the delay circuit 8, the subtracter 13, the multiplier 14, the constant multiplier 16 and the subtracter 17 of the eighth embodiment (FIG. 12) respectively, and hence redundant description is omitted. The data reproducing unit shown in FIG. 13 further comprises a voltage controlled oscillator 6, a low-pass filter 15, and an adder 18.

The sampler 1a samples an inputted first base band signal in accordance with a sampling clock which is supplied from the voltage controlled oscillator 6. The subsequent operations up to the multiplier 14a are identical to that of the eighth embodiment. The sampler 1b samples an inputted second base band signal in accordance with a sampling clock which is supplied from the voltage controlled oscillator 6. The subsequent operations up to the multiplier 14b are identical to that of the eighth embodiment. The adder 18 adds up timing error signals which are outputted from the multipliers 14a and 14b respectively with each other. The low-pass filter 15 extracts a low frequency component from the result of the addition, and supplies a control voltage to the voltage controlled oscillator 6. The voltage controlled oscillator 6 outputs the clock having a frequency depending on the control voltage, and supplies the same to the samplers 1a and 1b as the sampling clock.

In the ninth embodiment, both of the timing error signals obtained from the two base band inputs (both axes obtained in demodulation of a QPSK signal, for example) are employed for controlling the sampling timing. Therefore, the amount of disturbance of the sampling timing caused by noises included in the base band signals is reduced as compared with the case of utilizing only one base band signal.

It is obvious that the base band signal can be extended to at least two also as to each of the first to seventh embodiments, similarly to the case of the ninth embodiment.

In each of the first to ninth embodiments, the sampler may be implemented by an A/D converter. When the base band signal is converted to a digital signal by such an A/D converter, the subsequent delay circuit can be readily implemented by a flip-flop flop or the like while the arithmetic circuit such as the subtracter can also be implemented by a digital circuit, whereby a data reproducing unit which is suitable for integration can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A data reproducing method for reproducing original data from a sample value being obtained by sampling an input signal, comprising the steps of:

calculating a correlation value between a sample value series being obtained by sampling said input signal at a symbol rate and an estimate value series of a transmission symbol, corresponding to said sample value series, being shifted by one symbol on the time axis; and adjusting a point of time for sampling said input signal according to the polarity of said correlation value.

2. A data reproducing method for reproducing original data from a sample value being obtained by sampling an input signal, comprising the steps of:

calculating a first correlation value between a sample value series being obtained by sampling said input signal at a symbol rate and a first estimate value series being obtained by shifting an estimate value series of a transmission symbol corresponding to said sample value series by one symbol on the time axis;

calculating a second correlation value between said sample value series and a second estimate value series being obtained by shifting said estimate value series of said transmission symbol corresponding to said sample value series by one symbol oppositely to said first estimate value series; and adjusting a point of time for sampling said input signal according to the polarity of the difference between said first and second correlation values.

3. A data reproducing method for reproducing original data from a sample value being obtained by sampling an input signal, comprising the steps of;

calculating a difference value series by subtracting a constant multiple of an estimate value series of a transmission symbol corresponding to a sample value series being obtained by sampling said input signal at a symbol rate from said sample value series;

calculating a correlation value between said difference value series and an estimate value series being obtained by shifting said estimate value series by one symbol on the time axis; and adjusting a point of time for sampling said input signal according to the polarity of said correlation value.

4. A data reproducing method for reproducing original data from a sample value being obtained by sampling an input signal, comprising the steps of:

calculating a difference value series by subtracting a constant multiple of an estimate value series of a transmission symbol corresponding to a sample value series being obtained by sampling said input signal at a symbol rate from said sample value series;

calculating a first correlation value between said difference value series and a first estimate value series being obtained by shifting said estimate value series by one symbol on the time axis;

calculating a second correlation value between said difference value series and a second estimate value series being obtained by shifting said estimate value series by one symbol oppositely to said first estimate value series; and adjusting a point of time for sampling said input signal according to the polarity of the difference between said first and second correlation values.

5. A data reproducing method for reproducing original data from a sample value being obtained by sampling an input signal, comprising the steps of:

calculating a difference value series by subtracting a constant multiple of an estimate value series of a transmission symbol corresponding to a sample value series being obtained by sampling said input signal at a symbol rate from said sample value series;

calculating a correlation value between said difference value series and a first sample value series being obtained by shifting said sample value series by one symbol on the time axis; and adjusting a point of time for sampling said input signal according to the polarity of said correlation value.

6. A data reproducing method for reproducing original data from a sample value being obtained by sampling an input signal, comprising the steps of:

calculating a difference value series by subtracting a constant multiple of an estimate value series of a transmission symbol corresponding to a sample value series being obtained by sampling said input signal at a symbol rate from said sample value series;

calculating a first correlation value between said difference value series and a first sample value series being obtained by shifting said sample value series by one symbol on the time axis;

calculating a second correlation value between said difference value series and a second sample value series being obtained by shifting said sample value series by one symbol oppositely to said first sample value series; and adjusting a point of time for sampling said input signal according to the polarity of the difference between said first and second correlation values.

7. A data reproducing unit for reproducing original data from a sample value being obtained by sampling an input signal, comprising:

a clock generation part for generating a sampling clock;

a sampler for sampling said input signal in synchronization with said sampling clock and outputting said sample value;

estimate value generation means for generating an estimate value of a transmission symbol shifting from said sample value by one symbol on the time axis;

multiplication means for multiplying said estimate value by said sample value; and a low-pass filter for passing a low frequency component of the output of said multiplication means, a phase of said sampling clock in said clock generation means being changed by the output of said low-pass filter.

8. A data reproducing unit for reproducing original data from a sample value being obtained by sampling an input signal, comprising:

clock generation means for generating a sampling clock;

a sampler for sampling said input signal in synchronization with said sampling clock and outputting said sample value;

estimate value generation means for generating a first estimate value of a transmission symbol shifting from said sample value by one symbol on the time axis and a second estimate value of a transmission symbol shifting from said sample value by one symbol oppositely to said first estimate value;

first multiplication means for multiplying said sample value by said first estimate value;

second multiplication means for multiplying said sample value by said second estimate value;

a first low-pass filter for passing a low frequency component of the output of said first multiplication means;

a second low-pass filter for passing a low frequency component of the output of said second multiplication means; and subtraction means for subtracting the output of said second low-pass filter from that of said first low-pass filter, a phase of said sampling clock in said clock generation means being changed by the output of said subtraction means.

9. A data reproducing unit for reproducing original data from a sample value being obtained by sampling an input signal, comprising:

clock generation means for generating a sampling clock;

a sampler for sampling said input signal in synchronization with said sampling clock and outputting said sample value;

estimate value generation means for generating a first estimate value of a transmission symbol shifting from said sample value by one symbol on the time axis and a second estimate value of a transmission symbol shifting from said sample value by one symbol oppositely to said first estimate value;

subtraction means for subtracting said second estimate value from said first estimate value;

multiplication means for multiplying said sample value by the output of said subtraction means; and a low-pass filter for passing a low frequency component of the output of said multiplication means, a phase of said sampling clock in said clock generation means being changed by the output of said low-pass filter.

10. A data reproducing unit for reproducing original data from a sample value being obtained by sampling an input signal, comprising:

clock generation means for generating a sampling clock;

a sampler for sampling said input signal in synchronization with said sampling clock and outputting said sample value;

first arithmetic means for subtracting a constant multiple of an estimate value of a transmission symbol for said sample value from said sample value;

second arithmetic means for multiplying an estimate value of a transmission symbol shifting from said sample value by one symbol on the time axis by the output of said arithmetic means; and a low-pass filter for passing low frequency components of the outputs of said arithmetic means, a phase of said sampling clock in said clock generation means being changed by the output of said low-pass filter.

11. A data reproducing unit for reproducing original data from a sample value being obtained by sampling an input signal, comprising:

clock generation means for generating a sampling clock;

a sampler for sampling said input signal in synchronization with said sampling clock and outputting said sample value;

first arithmetic means for subtracting a constant multiple of an estimate value of a transmission symbol for said sample value from said sample value;

second arithmetic means for subtracting a second estimate value of a transmission symbol shifting from said sample value by one symbol oppositely to a first estimate value on the time axis from said first estimate value of a transmission symbol shifting from said sample value by one symbol on the time axis;

multiplication means for multiplying the output of said first arithmetic means by that of said second arithmetic means; and a low-pass filter for passing a low frequency component of the output of said multiplication means, a phase of said sampling clock in said clock generation means being changed by the output of said low-pass filter.

12. A data reproducing unit for reproducing original data from a sample value being obtained by sampling an input signal, comprising:

clock generation means for generating a sampling clock;

a sampler for sampling said input signal in synchronization with said sampling clock and outputting a first sample value;

arithmetic means for subtracting a constant multiple of an estimate value of a transmission symbol for said first sample value from said first sample value;

multiplication means for multiplying a second sample value shifting from said first sample value by one symbol on the time axis by the output of said arithmetic means; and a low-pass filter for passing a low frequency component of the output of said multiplication means, a phase of said sampling clock in said clock generation means being changed by the output of said low-pass filter.

13. A data reproducing unit for reproducing original data from a sample value being obtained by sampling an input signal, comprising:

clock generation means for generating a sampling clock;

a sampler for sampling said input signal in synchronization with said sampling clock and outputting said sample value;

arithmetic means for subtracting a constant multiple of an estimate value of a transmission symbol for a first sample value being in a prescribed time relation to said sample value from said first sample value, the output of said arithmetic means being delayed from said sample value by prescribed symbols on the time axis;

subtraction means for subtracting a third sample value shifting from the output of said arithmetic means by one symbol oppositely to a second sample value from said second sample value shifting from the output of said arithmetic means by one symbol on the time axis;

multiplication means for multiplying the output of said arithmetic means by that of said subtraction means; and a low-pass filter for passing the low frequency component of the output of said multiplication means, a phase of said sampling clock in said clock generation means being changed by the output of said low-pass filter.

* * * * *